United States Patent
Chien et al.

(10) Patent No.: US 11,121,166 B2
(45) Date of Patent: Sep. 14, 2021

(54) IMAGE SENSOR DEVICE

(71) Applicant: TAIWAN SEMICONDUCTOR MANUFACTURING CO., LTD., Hsinchu (TW)

(72) Inventors: Volume Chien, Tainan (TW); Yun-Wei Cheng, Taipei (TW); Zhe-Ju Liu, Taoyuan (TW); Kuo-Cheng Lee, Tainan (TW); Chi-Cherng Jeng, Tainan (TW); Chuan-Pu Liu, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/398,133

(22) Filed: Apr. 29, 2019

(65) Prior Publication Data
US 2019/0252429 A1 Aug. 15, 2019

Related U.S. Application Data

(62) Division of application No. 14/192,258, filed on Feb. 27, 2014, now Pat. No. 10,276,620.

(51) Int. Cl.
*H01L 27/146* (2006.01)

(52) U.S. Cl.
CPC ...... *H01L 27/1464* (2013.01); *H01L 27/1463* (2013.01); *H01L 27/14621* (2013.01);
(Continued)

(58) Field of Classification Search
CPC ............. H01L 27/1463; H01L 27/1464; H01L 31/02164; H01L 29/4236
See application file for complete search history.

(56) References Cited

U.S. PATENT DOCUMENTS 5,611,941 A   3/1997   Booth
5,628,663 A   5/1997   Potter
(Continued)

FOREIGN PATENT DOCUMENTS

KR   10-0670606 B1   1/2007

OTHER PUBLICATIONS

Lee, S. H. et al., "Selective removal of CuIn1-xGaxSe2 absorber layer with no edge melting using a nanosecond Nd:YAG laser", J. Phys. D: Appl. Phys. 46 (2013) 105502. Published Feb. 8, 2013.
(Continued)

*Primary Examiner* — Cuong Q Nguyen
*Assistant Examiner* — Peter M Albrecht
(74) *Attorney, Agent, or Firm* — Birch, Stewart, Kolasch & Birch, LLP

(57) ABSTRACT

An image sensor device is provided. The image sensor device includes a semiconductor substrate including a front surface, a back surface opposite to the front surface, and a light-sensing region extending from the front surface into the semiconductor substrate. The image sensor device includes a light-blocking structure in the semiconductor substrate and surrounding the light-sensing region. The light-blocking structure includes a conductive light reflection structure and a light absorption structure, and the light absorption structure is between the conductive light reflection structure and the back surface. The image sensor device includes an insulating layer between the light-blocking structure and the semiconductor substrate.

20 Claims, 8 Drawing Sheets

(52) U.S. Cl.
CPC .. *H01L 27/14623* (2013.01); *H01L 27/14629* (2013.01); *H01L 27/14627* (2013.01)

(56) References Cited

U.S. PATENT DOCUMENTS

| | | | |
|---|---|---|---|
| 5,721,148 A * | 2/1998 | Nishimura | H01L 29/7827 438/270 |
| 6,118,142 A | 9/2000 | Chen et al. | |
| 6,734,081 B1 | 5/2004 | Puchner et al. | |
| 7,315,014 B2 | 1/2008 | Lee et al. | |
| 7,477,440 B1 | 1/2009 | Huang | |
| 8,278,130 B2 * | 10/2012 | Kim | H01L 27/14634 438/59 |
| 8,426,938 B2 | 4/2013 | Park et al. | |
| 2002/0153529 A1 | 10/2002 | Shie | |
| 2004/0089914 A1 * | 5/2004 | Mouli | H01L 21/02639 257/510 |
| 2005/0151228 A1 | 7/2005 | Tanida et al. | |
| 2006/0081890 A1 | 4/2006 | Kang | |
| 2007/0145516 A1 | 6/2007 | Lee | |
| 2008/0308738 A1 | 12/2008 | Li et al. | |
| 2010/0155868 A1 | 6/2010 | Jang | |
| 2011/0108939 A1 | 5/2011 | Marty et al. | |
| 2011/0156186 A1 | 6/2011 | Iida et al. | |
| 2011/0198732 A1 | 8/2011 | Lin et al. | |
| 2011/0266645 A1 | 11/2011 | Chao | |
| 2012/0217601 A1 | 8/2012 | Miyanami | |
| 2012/0217602 A1 | 8/2012 | Enomoto | |
| 2012/0312962 A1 | 12/2012 | Hebert | |
| 2013/0234276 A1 * | 9/2013 | Hiyama | H01L 27/14627 257/435 |
| 2013/0249031 A1 * | 9/2013 | Oganesian | H01L 27/14685 257/432 |
| 2013/0249039 A1 | 9/2013 | Hsu et al. | |
| 2013/0323875 A1 | 12/2013 | Park et al. | |
| 2014/0015085 A1 | 1/2014 | Ikeda et al. | |
| 2014/0077323 A1 | 3/2014 | Velichko et al. | |
| 2014/0110809 A1 | 4/2014 | Kitamura et al. | |
| 2014/0160335 A1 * | 6/2014 | Shimotsusa | H01L 27/14698 348/311 |
| 2014/0239361 A1 | 8/2014 | Ma | |
| 2014/0353468 A1 | 12/2014 | Choi et al. | |
| 2015/0035028 A1 * | 2/2015 | Fan | H01L 27/14638 257/292 |
| 2015/0077841 A1 | 3/2015 | Matsuo et al. | |
| 2015/0155327 A1 | 6/2015 | Kuboi | |

OTHER PUBLICATIONS

Pal et al., "Effects of Crystallization and Dopant Concentration on the Emission Behavior of TiO2: Eu Nanophosphors," Nanoscale Research Letters, vol. 7, No. 1, Jan. 3, 2012, pp. 1-12.

Wu, Claudia et al., "Black silicon: A new light absorber for photovoltaic applications", OSA/CLEO 1998.

Yuan et al., "Influence of Purity of HfO2 on Reflectance of Ultraviolet Multilayer," Chinese Optics Letters, vol. 6, No. 3, Mar. 10, 2008, pp. 222-224.

\* cited by examiner

IMAGE SENSOR DEVICE

CROSS REFERENCE

This application is a Divisional of U.S. application Ser. No. 14/192,258, filed on Feb. 27, 2014, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Along with the advantages realized from reducing geometry size, improvements are being made directly to the IC devices. One such IC device is an image sensor device. An image sensor device includes a pixel array (or grid) for detecting light and recording intensity (brightness) of the detected light. The pixel array responds to the light by accumulating a charge. The higher the intensity of the light is, the more the charge is accumulated in the pixel array. The accumulated charge is then used (for example, by other circuitry) to provide image information for use in a suitable application, such as a digital camera.

However, since the feature sizes continue to decrease, fabrication processes continue to become more difficult to perform. Therefore, it is a challenge to form reliable image sensor devices with smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
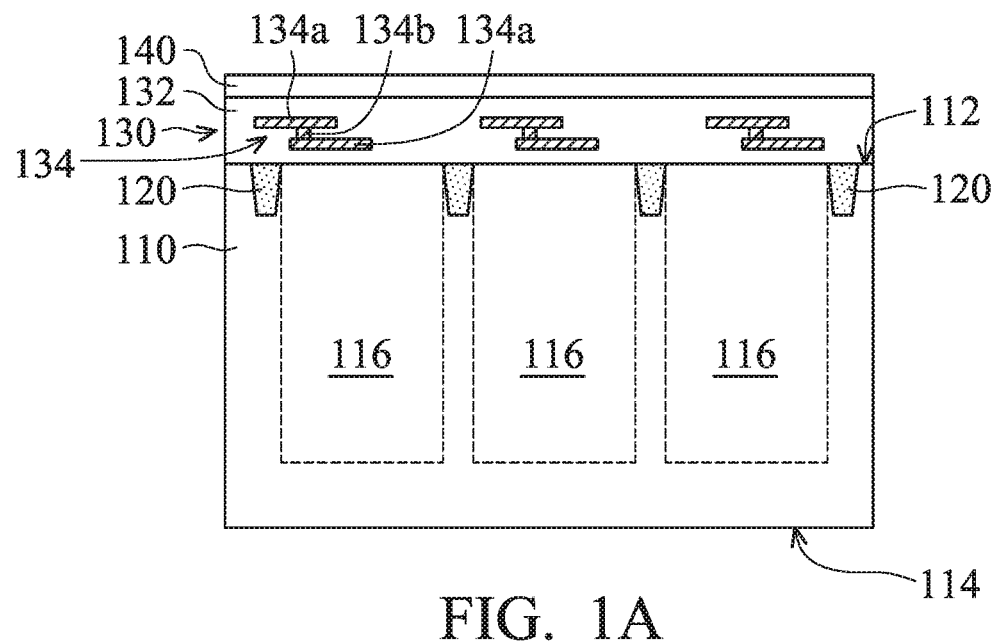
FIGS. 1A-1D are cross-sectional views of various stages of a process for forming an image sensor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

FIGS. 1A-1D are cross-sectional views of various stages of a process for forming an image sensor device 100, in accordance with some embodiments. As shown in FIG. 1A, a semiconductor substrate 110 is provided. The semiconductor substrate 110 has a front surface 112 and a back surface 114 opposite to the front surface 112.

The semiconductor substrate 110 may be a silicon substrate doped with a P-type dopant such as boron, in which case the semiconductor substrate 110 is a P-type substrate. Alternatively, the semiconductor substrate 110 could be another suitable semiconductor material. For example, the semiconductor substrate 110 may be a silicon substrate doped with an N-type dopant such as phosphorous or arsenic, in which case the substrate is an N-type substrate. The semiconductor substrate 110 may include other elementary semiconductor materials such as germanium.

In some embodiments, isolation structures 120 are formed in the semiconductor substrate 110 to define various light-sensing regions in the semiconductor substrate 110, and to electrically isolate neighboring devices (e.g. transistors) from one another. In some embodiments, the isolation features 120 are formed adjacent to or near the front surface 112.

In some embodiments, the isolation structures 120 are made of a dielectric material, such as silicon oxide, silicon nitride, silicon oxynitride, fluoride-doped silicate glass (FSG), a low-K dielectric material, other suitable materials, or combinations thereof. In some embodiments, the isolation structures 120 are formed by using an isolation technology, such as local oxidation of semiconductor (LOCOS), shallow trench isolation (STI), or the like.

In some embodiments, the formation of the isolation structures 120 includes patterning the semiconductor substrate 110 by a photolithography process, etching trenches in the semiconductor substrate 110 (for example, by using a dry etching, wet etching, plasma etching process, or combinations thereof), and filling the trenches (for example, by using a chemical vapor deposition process) with the dielectric material. In some embodiments, the filled trenches may have a multi-layer structure, such as a thermal oxide liner layer filled with silicon nitride or silicon oxide.

In some embodiments, the semiconductor substrate 110 is fabricated with front end processes, in accordance with some embodiments. For example, the semiconductor substrate 110 includes various regions, which may include a pixel region, a periphery region, a bonding pad region, and a scribe line region. For the sake of simplicity, only a portion of the pixel region is shown in FIGS. 1 to 4.

The pixel region includes pixels each with a light-sensing region 116 (also referred to as a radiation-sensing region). The light-sensing regions 116 of the pixels are doped with a doping polarity opposite from that of the semiconductor substrate 110. The light-sensing regions 116 are formed by one or more implantation processes or diffusion processes. The light-sensing regions 116 are formed close to (or adjacent to, or near) the front surface 112 of the semiconductor substrate 110. The light-sensing regions 116 are operable to sense incident light (or incident radiation) that enters the pixel region. The incident light may be visible light. Alternatively, the incident light may be infrared (IR), ultraviolet (UV), X-ray, microwave, other suitable types of light, or a combination thereof.

Although only a portion of the pixel region is shown in FIGS. 1A-1D, the pixel region may further include pinned layers, photodiode gates, reset transistors, source follower transistors, and transfer transistors. The transfer transistors are electrically connected with the light-sensing regions 116 to collect (or pick up) electrons generated by incident light (incident radiation) traveling into the light-sensing regions 116 and to convert the electrons into voltage signals, in accordance with some embodiments. For the sake of simplicity, detailed structures of the above features are not shown in figures of the present disclosure.

In some embodiments, an interconnection structure 130 is formed over the front surface 112. The interconnection structure 130 includes a number of patterned dielectric layers and conductive layers that couple to various doped features, circuitry, photodiode gates, reset transistors, source follower transistors, and transfer transistors. For example, the interconnection structure 130 includes an interlayer dielectric (ILD) layer 132 and a multilayer interconnection (MLI) structure 134 in the ILD layer 132.

The MLI structure 134 includes conductive lines 134a and vias (or contacts) 134b connected between the conductive lines 134a. It should be understood that the conductive lines 134a and the vias 134b are merely exemplary. The actual positioning and configuration of the conductive lines 134a and the vias 134b may vary depending on design needs and manufacturing concerns.

Figure 1B:
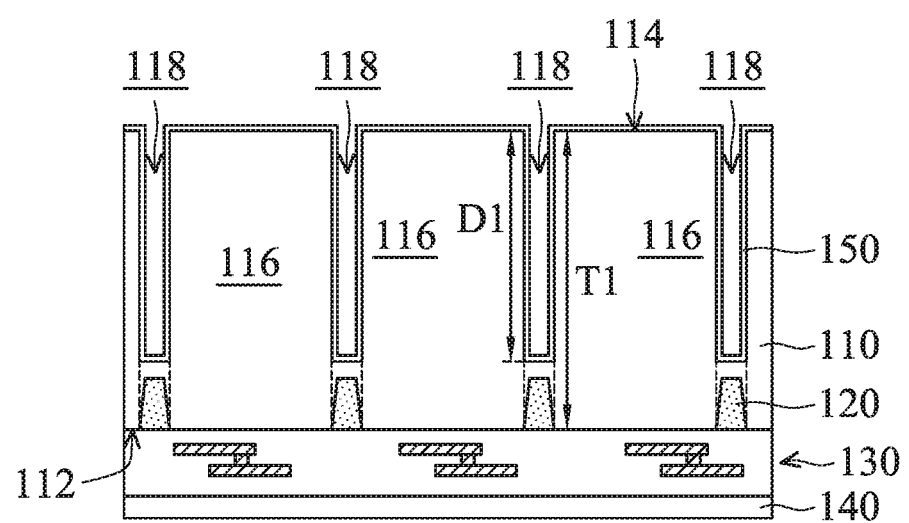

Afterwards, a carrier substrate 140 is bonded with the interconnection structure 130, in accordance with some embodiments. The carrier substrate 140 includes a silicon substrate, a glass substrate or another suitable substrate. Thereafter, as shown in FIGS. 1A and 1B, a thinning process is performed to thin the semiconductor substrate 110 from the back surface 114. The thinning process may include a chemical mechanical polishing process.

Afterwards, the semiconductor substrate 110 is flipped over, and deep trenches 118 are formed in the semiconductor substrate 110, in accordance with some embodiments. The deep trenches 118 extend from the back surface 114, in accordance with some embodiments. The deep trenches 118 are between the light-sensing regions 116, in accordance with some embodiments. In some embodiments, the deep trenches 118 are above the isolation structures 120, respectively. In some embodiments, a ratio of a depth D1 of the deep trenches 118 to a thickness T1 of the semiconductor substrate 110 ranges from about 10% to about 100%. In some embodiments, the ratio of the depth D1 of the deep trenches 118 to the thickness T1 of the semiconductor substrate 110 ranges from about 50% to about 100%.

Afterwards, an insulating layer 150 (also referred to as a liner layer) is formed on the back surface 114 of the semiconductor substrate 110, bottom surfaces and inner walls of the deep trenches 118, in accordance with some embodiments. In some embodiments, the insulating layer 150 is configured to passivate the back surface 114 of the semiconductor substrate 110, the bottom surfaces and the inner walls of the deep trenches 118. In some embodiments, the insulating layer 150 is also configured to electrically isolate the light-sensing regions 116 from one another to reduce electrical crosstalk between the light-sensing regions 116. The insulating layer 150 includes silicon oxides or other suitable insulating materials. The insulating layer 150 is formed by, for example, a thermal oxidation process.

Figure 1C:
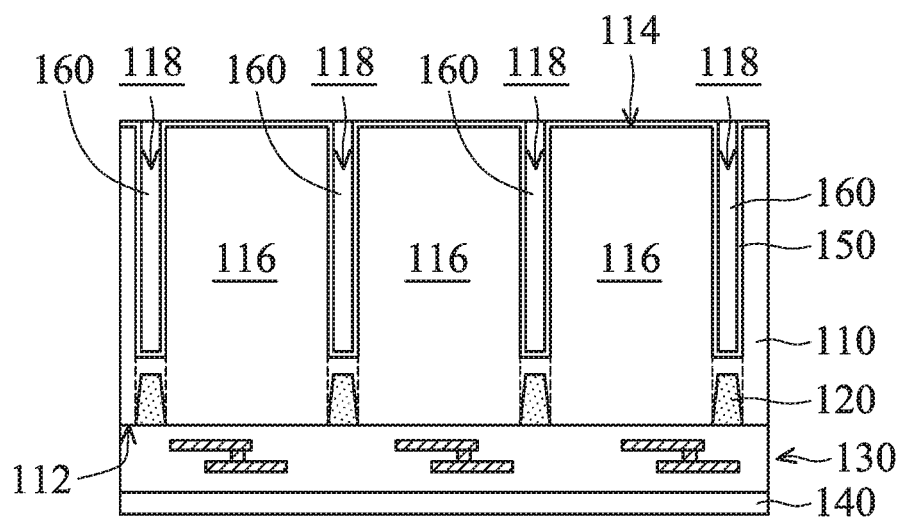

Thereafter, as shown in FIG. 1C, light-blocking structures 160 are formed in the deep trenches 118, respectively. The deep trenches 118 are filled with the light-blocking structures 160, in accordance with some embodiments. The light-blocking structures 160 are between the light-sensing regions 116, in accordance with some embodiments. The light-blocking structures 160 are configured to block incident light to prevent the incident light from traveling between different light-sensing regions 116, in accordance with some embodiments.

In some embodiments, the light-blocking structures 160 include light absorption structures. In some embodiments, the light absorption structures have a light absorptivity ranging from about 60% to about 100%. In some embodiments, the light absorption structures are configured to absorb the incident light arriving at the light absorption structures to prevent the incident light from traveling between different light-sensing regions 116.

In some embodiments, the light absorption structures include a black silicon material, a semiconductor material with a band gap smaller than 1.5 eV (e.g., Ge, InSb, or InAs), or a polymer material (e.g., an opaque polymer material). In some embodiments, the light absorption structures include a non-visible light filter (e.g. an IR filter or a UV filter) enabled to block visible light and transmit non-visible light.

Alternatively, in some embodiments, the light-blocking structures 160 include light reflection structures. In some embodiments, the light reflection structures have a refractive index lower than that of the semiconductor substrate 110, and therefore a portion of the incident light arriving at the light reflection structures is reflected, which is a phenomenon called "total internal reflection". The light reflection structures include dielectric materials, such as silicon oxides, silicon nitrides, or silicon carbides.

In some embodiments, light reflection structures have a light reflectivity ranging from about 60% to about 100%. In some embodiments, the light reflection structures include a metal material or an alloy material. The light reflection structures include Al, W, Cu, Ti, alloys thereof, combinations thereof, or other suitable reflective materials.

In some embodiments, the method of forming the light-blocking structures 160 includes depositing a light-blocking material layer on the semiconductor substrate 110 and filled in the deep trenches 118; and removing the light-blocking material layer outside of the deep trenches 118. The method of depositing the light-blocking material layer includes performing a chemical vapor deposition (CVD) process, a physical vapor deposition (PVD) process, a coating process or another suitable process. The method of removing the light-blocking material layer outside of the deep trenches 118 includes performing a chemical mechanical polishing (CMP) process or another suitable process.

Thereafter, an anti-reflection coating (ARC) layer 170 and a buffer layer 180 are sequentially formed over the back surface 114 of the semiconductor substrate 110, in accordance with some embodiments. The ARC layer 170 is used to reduce optical reflection from the back surface 114 of the semiconductor substrate 110 to ensure that most of an incident light enters the light-sensing regions 116 and is sensed.

The ARC layer 170 may be made of a high-k material, a dielectric material, other applicable materials, or a combination thereof. The high-k material may include hafnium oxide, tantalum pentoxide, zirconium dioxide, aluminum oxide, other suitable materials, or a combination thereof. The dielectric material includes, for example, silicon nitride, silicon oxynitride, other suitable materials, or a combination thereof.

The buffer layer 180 is used as a buffer between the ARC layer 170 and an overlying layer subsequently formed. The buffer layer 180 may be made of a dielectric material or other suitable materials. For example, the buffer layer 180 is made of silicon oxide, silicon nitride, silicon oxynitride, other applicable materials, or a combination thereof.

Thereafter, a reflective grid 190 is formed over the buffer layer 180, in accordance with some embodiments. The reflective grid 190 may include reflective elements 192. In some embodiments, the reflective elements 192 are aligned with the light-blocking structures 160, respectively. Each of the reflective elements 192 is used to prevent the incident light from entering a neighboring pixel. The crosstalk problems between pixels are thus prevented or reduced.

In some embodiments, the reflective grid 190 is made of a reflective material such as a metal material. The reflective grid 190 may be made of aluminum, silver, copper, titanium, platinum, tungsten, tantalum, tantalum nitride, other suitable materials, or a combination thereof. In some embodiments, the reflective grid 190 is formed over the buffer layer 180 using a suitable process. The suitable process includes, for example, a PVD process, an electroplating process, a CVD process, other applicable processes, or a combination thereof.

Afterwards, a dielectric layer 210 is formed over the buffer layer 180 to cover the reflective grid 190, in accordance with some embodiments. The dielectric layer 210 may be made of silicon oxide, silicon nitride, silicon oxynitride, or other suitable materials. The dielectric layer 210 is formed by a CVD process or another suitable process. The dielectric layer 210 has multiple recesses 212R, 212G, and 212B.

Thereafter, visible light filters (such as color filters 220R, 220G, and 220B) are formed in the recesses 212R, 212G, and 212B, respectively. In some embodiments, the visible light filters may be used to filter through visible light. The color filters 220R, 220G, and 220B may be used to filter through a red wavelength band, a green wavelength band, and a blue wavelength band, respectively. In some embodiments, the light-blocking structures 160 include a non-visible light filter (e.g. an IR filter or a UV filter) enabled to block the visible light passing though the visible light filters.

Afterwards, lenses 230 are respectively formed over the color filters 220R, 220G, and 220B, in accordance with some embodiments. The lenses 230 are used to direct or focus the incident light. The lenses 230 may include a microlens array. The lenses 230 may be made of a high transmittance material. For example, the high transmittance material includes transparent polymer material (such as polymethylmethacrylate, PMMA), transparent ceramic material (such as glass), other applicable materials, or a combination thereof. In this step, an image sensor device 100 is substantially formed, in accordance with some embodiments.

Figure 1D:
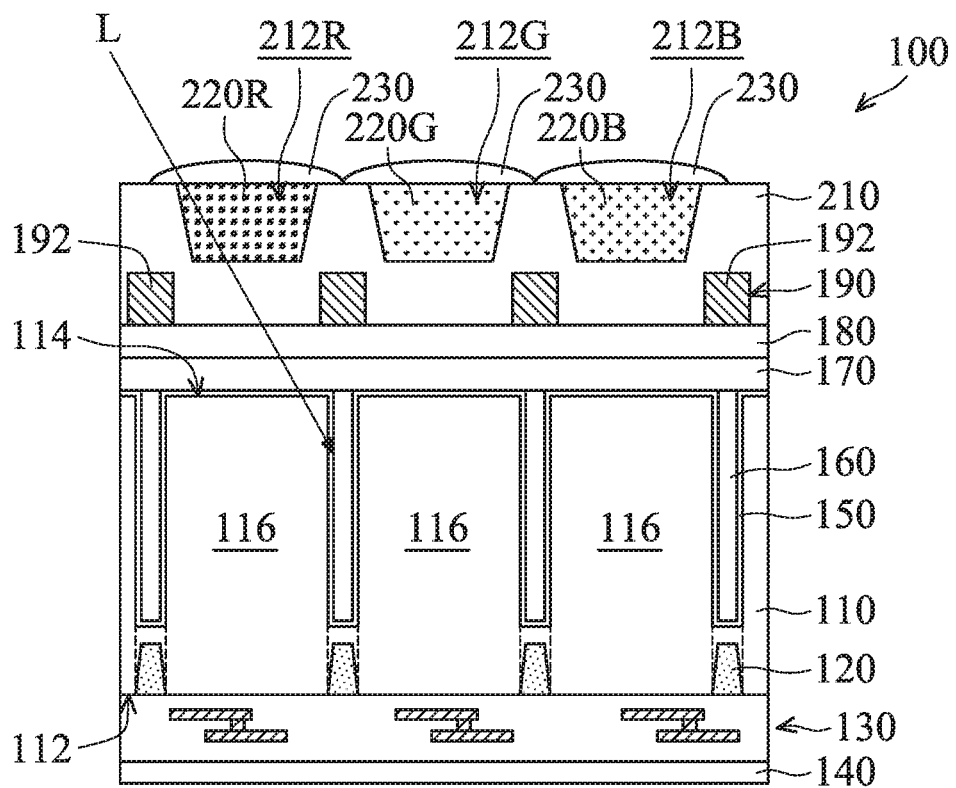

As shown in FIG. 1D, an incident light L passing through the color filters 220R and arriving at the light-blocking structure 160 may be absorbed or reflected by the light-blocking structure 160. Therefore, the light-blocking structure 160 may reduce optical crosstalk.

Figure 2A:
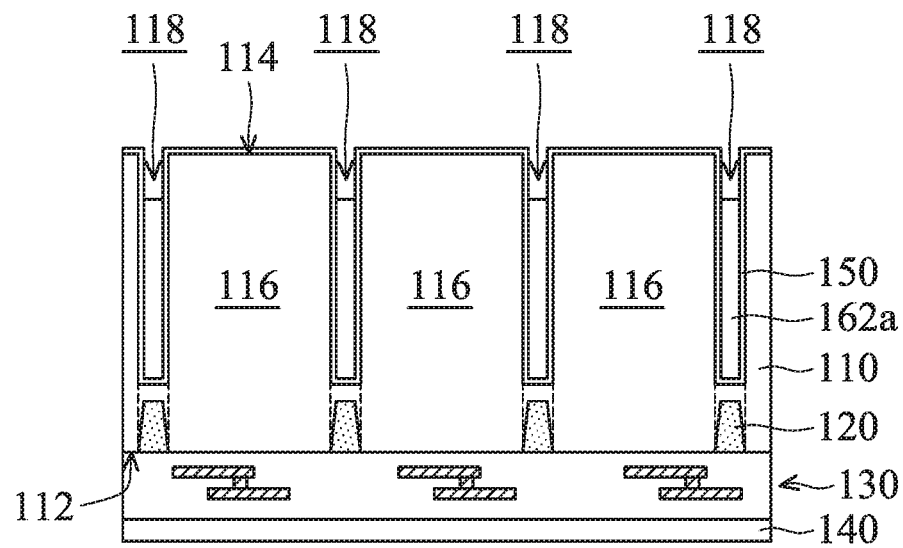
FIGS. 2A-2C are cross-sectional views of various stages of a process for forming an image sensor device, in accordance with some embodiments.
Figure 2B:
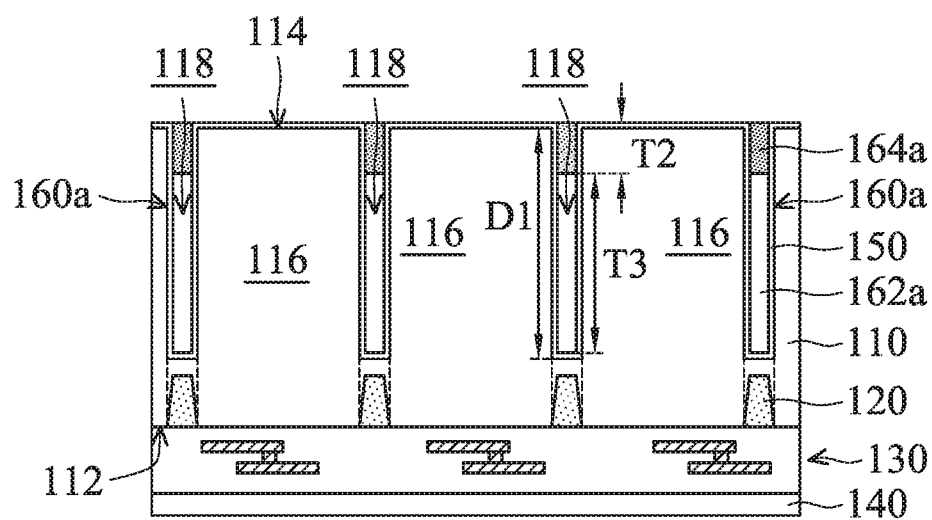
Figure 2C:
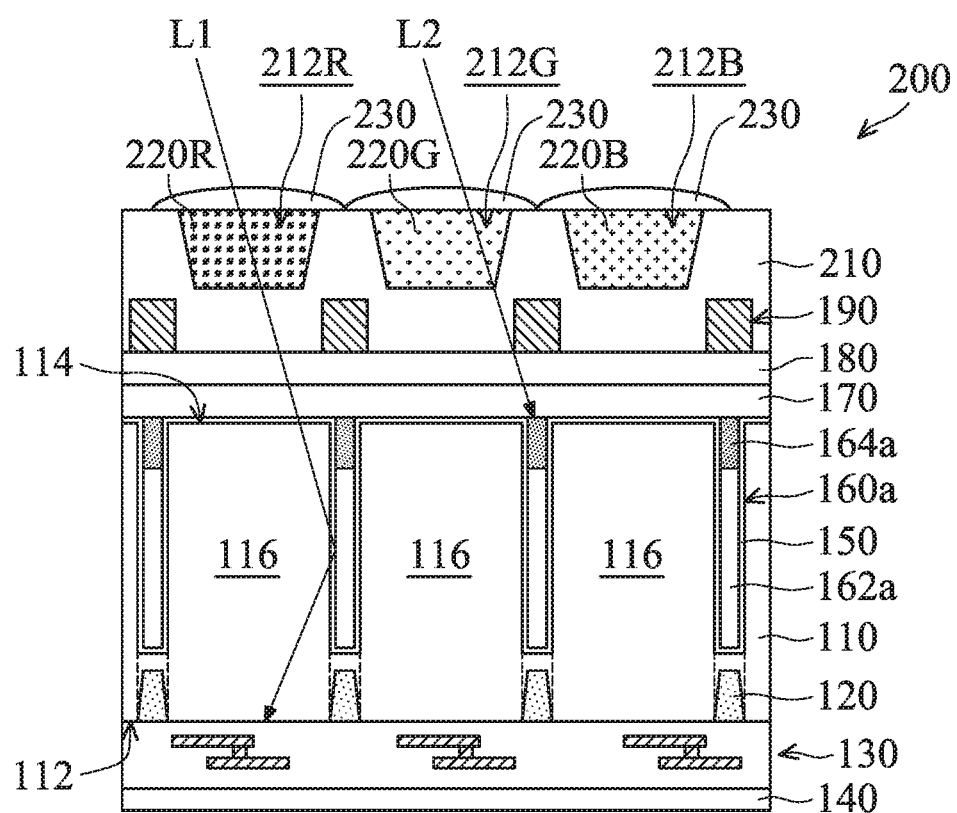

FIGS. 2A-2C are cross-sectional views of various stages of a process for forming an image sensor device 200, in accordance with some embodiments. As shown in FIG. 2A, after the step of FIG. 1B, light reflection structures 162a are formed in the deep trenches 118, respectively. Each of the light reflection structures 162a is partially filled in the corresponding deep trench 118. The materials of the light reflection structures 162a are substantially similar to those of the light reflection structures of the embodiments of FIGS. 1A-1D.

In some embodiments, the method of forming the light reflection structures 162a includes depositing a light reflection material layer on the semiconductor substrate 110 and filled in the deep trenches 118; removing the light reflection material layer outside of the deep trenches 118; and removing a portion of the light reflection material layer in the deep trenches 118.

The method of depositing the light reflection material layer includes performing a chemical vapor deposition (CVD) process, a physical vapor deposition (PVD) process, a coating process or another suitable process. The method of removing the light reflection material layer outside of the deep trenches 118 includes performing a chemical mechanical polishing (CMP) process or another suitable process. The method of removing the portion of the light reflection material layer in the deep trenches 118 includes performing a wet etching process, a dry etching process or another suitable process.

Afterwards, as shown in FIG. 2B, light absorption structures 164a are formed on the light reflection structures 162a in the deep trenches 118, respectively. In some embodiments, a ratio of a thickness T2 of the light absorption structure 164a to the depth D1 of the deep trench 118 ranges from about 10% to about 30%. In some embodiments, a ratio of a thickness T3 of the light reflection structure 162a to the depth D1 of the deep trench 118 ranges from about 70% to about 90%.

The materials of the light absorption structures 164a are substantially similar to those of the light absorption structures of the embodiments of FIGS. 1A-1D. In each of the deep trenches 118, the light reflection structure 162a and the light absorption structure 164a constitute a light-blocking structure 160a.

In some embodiments, the method of forming the light absorption structures 164a includes depositing a light absorption material layer on the semiconductor substrate 110 and filled in the deep trenches 118; and removing the light absorption material layer outside of the deep trenches 118.

The method of depositing the light absorption material layer includes performing a chemical vapor deposition (CVD) process, a physical vapor deposition (PVD) process, a coating process or another suitable process. The method of removing the light absorption material layer outside of the deep trenches 118 includes performing a chemical mechanical polishing (CMP) process or another suitable process.

As shown in FIG. 2C, an anti-reflection coating (ARC) layer 170, a buffer layer 180, a reflective grid 190, a dielectric layer 210, visible light filters (such as color filters 220R, 220G, and 220B), and lenses 230 are sequentially formed over the back surface 114 of the semiconductor substrate 110, in accordance with some embodiments. In this step, an image sensor device 200 is substantially formed, in accordance with some embodiments. In some embodiments, the light absorption structures 164a are positioned closer to the back surface 114 than to the front surface 112, and the light reflection structures 162a are positioned closer to the front surface 112 than to the back surface 114.

As shown in FIG. 2C, an incident light L1 passing through the color filters 220R and arriving at the light reflection structure 162a is reflected by the light reflection structures 162a, in accordance with some embodiments. An incident light L2 passing through the color filters 220G and arriving at the light absorption structure 164a may be absorbed by the light absorption structure 164a, which prevents the incident light L2 from being reflected to an adjacent light-sensing region 116. Therefore, the light-blocking structures 160a composed of the light reflection structure 162a and the light absorption structure 164a may reduce optical crosstalk.

Figure 3A:
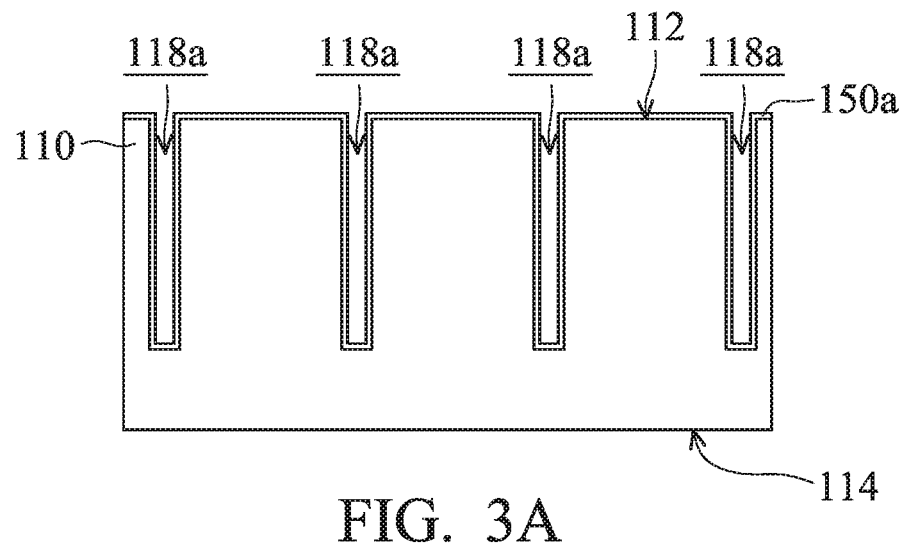
FIGS. 3A-3D are cross-sectional views of various stages of a process for forming an image sensor device, in accordance with some embodiments.

FIGS. 3A-3D are cross-sectional views of various stages of a process for forming an image sensor device 300, in accordance with some embodiments. As shown in FIG. 3A, a semiconductor substrate 110 is provided. The semiconductor substrate 110 has a front surface 112 and a back surface 114 opposite to the front surface 112.

Afterwards, deep trenches 118a are formed in the semiconductor substrate 110 to define various light-sensing regions in the semiconductor substrate 110, in accordance with some embodiments. The deep trenches 118a extend from the front surface 112, in accordance with some embodiments. Thereafter, an insulating layer 150a is formed on the front surface 112 of the semiconductor substrate 110, bottom surfaces and inner walls of the deep trenches 118a, in accordance with some embodiments. In some embodiments, the insulating layer 150a is configured to electrically isolate light-sensing regions subsequently formed from one another to reduce electrical crosstalk between the light-sensing regions.

Figure 3B:
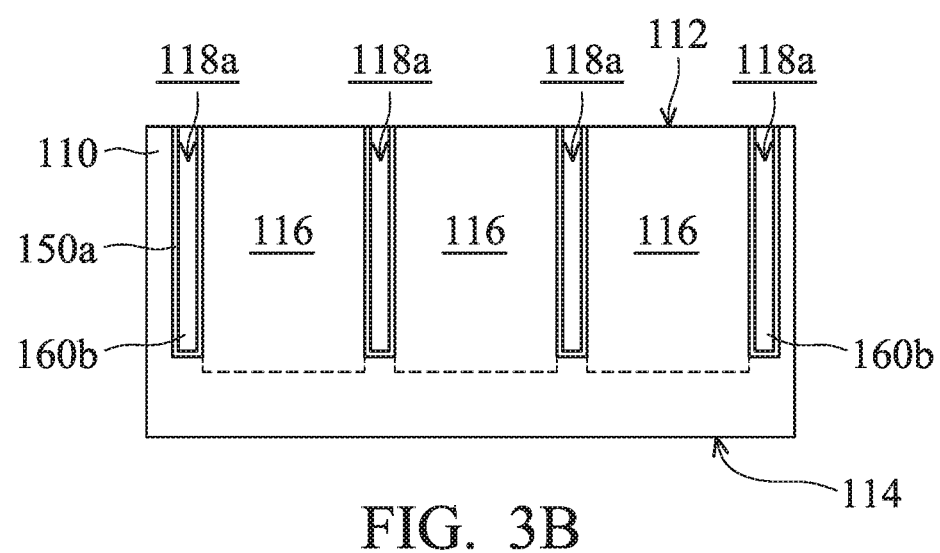

As shown in FIG. 3B, light-blocking structures 160b are formed in the deep trenches 118a, respectively. The deep trenches 118a are filled with the light-blocking structures 160b, in accordance with some embodiments. In some embodiments, the light-blocking structures 160b include light absorption structures or light reflection structures.

In some embodiments, the method of forming the light-blocking structures 160b includes depositing a light-blocking material layer on the front surface 112 of the semiconductor substrate 110 and filled in the deep trenches 118a; and removing the light-blocking material layer outside of the deep trenches 118a. In some embodiments, the insulating layer 150a outside of the deep trenches 118a is also removed during the removing of the light-blocking material layer outside of the deep trenches 118a.

Afterwards, light-sensing regions 116 are formed in the semiconductor substrate 110 and between the deep trenches 118a. The light-sensing regions 116 are formed by one or more implantation processes or diffusion processes. The light-sensing regions 116 are formed close to (or adjacent to, or near) the front surface 112 of the semiconductor substrate 110.

Figure 3C:
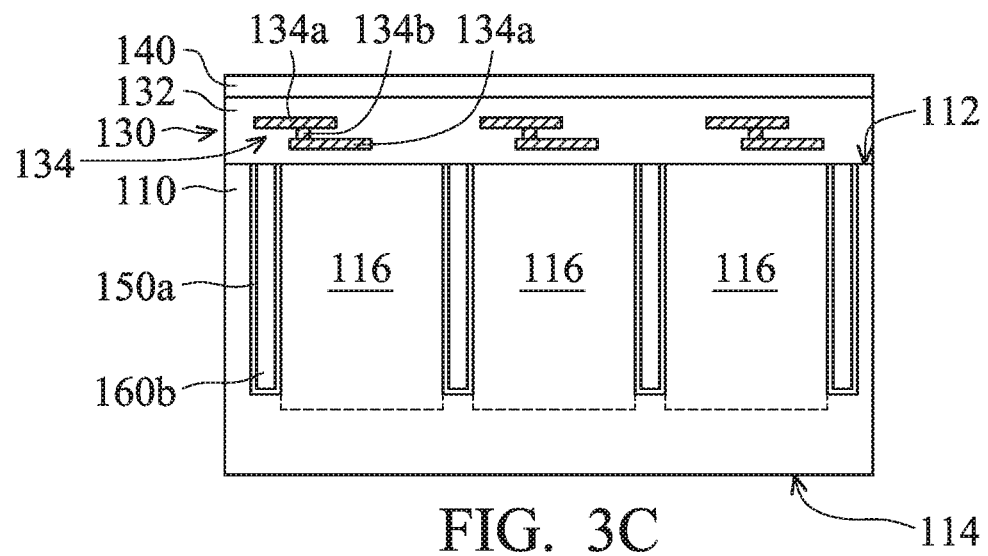

As shown in FIG. 3C, an interconnection structure 130 is formed over the front surface 112. The interconnection structure 130 includes a number of patterned dielectric layers and conductive layers that couple to various doped features, circuitry, photodiode gates, reset transistors, source follower transistors, and transfer transistors.

For example, the interconnection structure 130 includes an interlayer dielectric (ILD) layer 132 and a multilayer interconnection (MLI) structure 134 in the ILD layer 132. The MLI structure 134 includes conductive lines 134a and vias (or contacts) 134b connected between the conductive lines 134a. Afterwards, a carrier substrate 140 is bonded with the interconnection structure 130, in accordance with some embodiments.

Figure 3D:
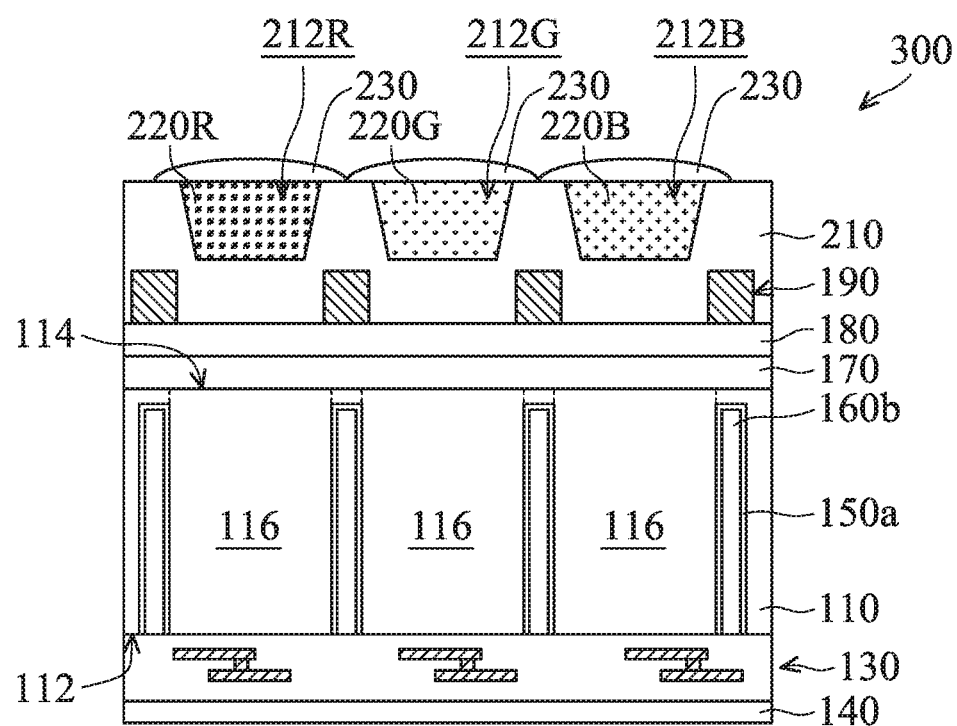

Thereafter, as shown in FIGS. 3C and 3D, a thinning process is performed to thin the semiconductor substrate 110 from the back surface 114. Afterwards, the semiconductor substrate 110 is flipped over. As shown in FIG. 3D, an anti-reflection coating (ARC) layer 170, a buffer layer 180, a reflective grid 190, a dielectric layer 210, visible light filters (such as color filters 220R, 220G, and 220B), and lenses 230 are sequentially formed over the back surface 114 of the semiconductor substrate 110, in accordance with some embodiments. In this step, an image sensor device 300 is substantially formed, in accordance with some embodiments.

Figure 4A:
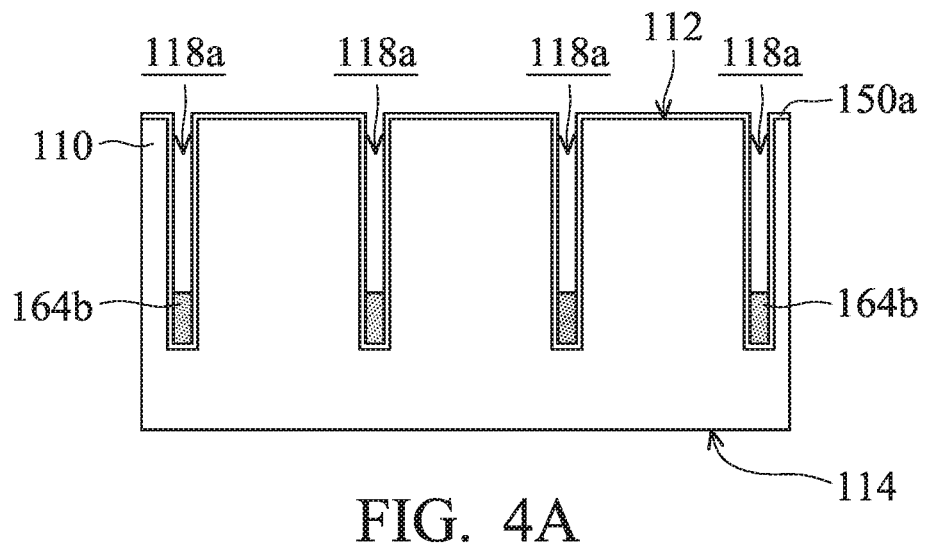
FIGS. 4A-4D are cross-sectional views of various stages of a process for forming an image sensor device, in accordance with some embodiments.

FIGS. 4A-4D are cross-sectional views of various stages of a process for forming an image sensor device 400, in accordance with some embodiments. As shown in FIG. 4A, after the step of FIG. 3A, light absorption structures 164b are formed in the deep trenches 118a, respectively. Each of the light absorption structures 164b is partially filled in the corresponding deep trench 118a. The materials of the light absorption structures 164b are substantially similar to those of the light absorption structures of the embodiments of FIGS. 1A-1D.

In some embodiments, the method of forming the light absorption structures 164b includes depositing a light absorption material layer on the semiconductor substrate 110 and filled in the deep trenches 118a; removing the light absorption material layer outside of the deep trenches 118a; and removing a portion of the light absorption material layer in the deep trenches 118a. In some embodiments, the insulating layer 150a outside of the deep trenches 118a is also removed during the removal of the light absorption material layer outside of the deep trenches 118a.

The method of depositing the light absorption material layer includes performing a CVD process, a PVD process, a coating process or another suitable process. The method of removing the light absorption material layer outside of the deep trenches 118a includes performing a CMP process or another suitable process. The method of removing the portion of the light absorption material layer in the deep trenches 118a includes performing a wet etching process, a dry etching process or another suitable process.

Figure 4B:
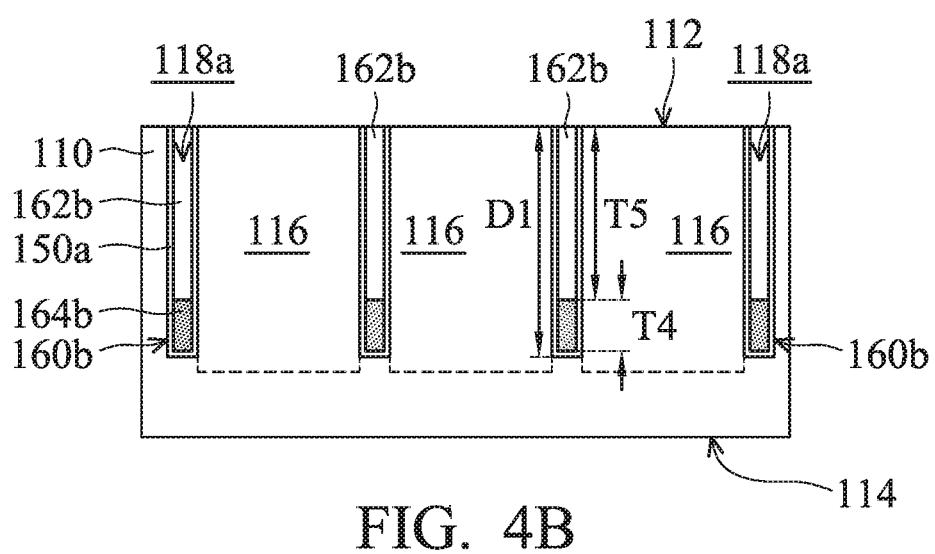

Afterwards, as shown in FIG. 4B, light reflection structures 162b are formed on the light absorption structures 164b in the deep trenches 118a, respectively. In some embodiments, a ratio of a thickness T4 of the light absorption structure 164b to the depth D1 of the deep trench 118a ranges from about 10% to about 30%. In some embodiments, a ratio of a thickness T5 of the light reflection structure 162b to the depth D1 of the deep trench 118a ranges from about 70% to about 90%.

The materials of the light reflection structures 162b are substantially similar to that of the light reflection structures of the embodiments of FIGS. 1A-1D. In each of the deep trenches 118a, the light absorption structure 164b and the light reflection structure 162b constitute a light-blocking structure 160b.

In some embodiments, the method of forming the light reflection structures 162b includes depositing a light reflection material layer on the semiconductor substrate 110 and filled in the deep trenches 118a; and removing the light reflection material layer outside of the deep trenches 118a.

The method of depositing the light reflection material layer includes performing a CVD process, a PVD process, a coating process or another suitable process. The method of removing the light reflection material layer outside of the deep trenches 118a includes performing a CMP process or another suitable process. Afterwards, light-sensing regions 116 are formed in the semiconductor substrate 110 and between the deep trenches 118a.

Figure 4C:
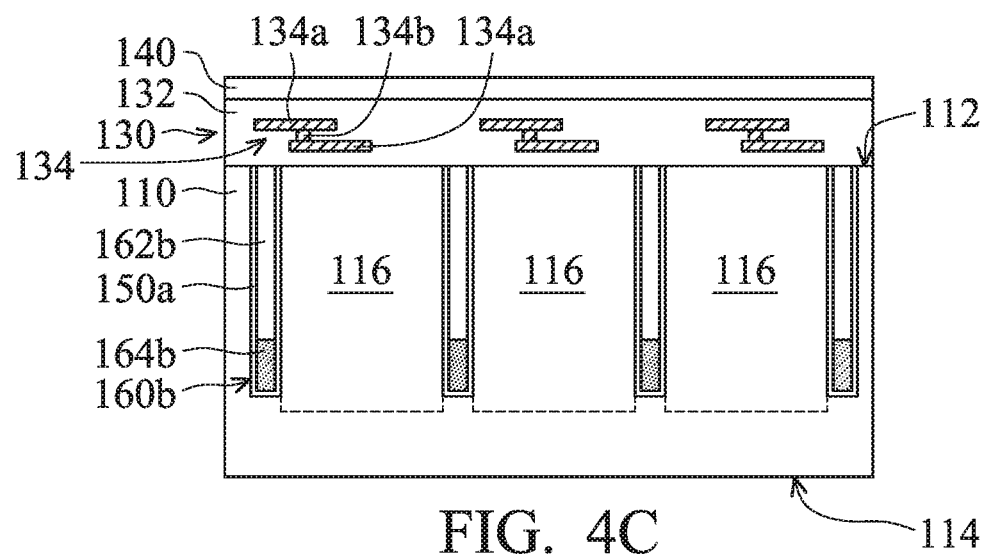

As shown in FIG. 4C, an interconnection structure 130 is formed over the front surface 112. The interconnection structure 130 includes a number of patterned dielectric layers and conductive layers that couple to various doped features, circuitry, photodiode gates, reset transistors, source follower transistors, and transfer transistors.

For example, the interconnection structure 130 includes an interlayer dielectric (ILD) layer 132 and a multilayer interconnection (MLI) structure 134 in the ILD layer 132. The MLI structure 134 includes conductive lines 134a and vias (or contacts) 134b connected between the conductive lines 134a. Afterwards, a carrier substrate 140 is bonded with the interconnection structure 130, in accordance with some embodiments.

Figure 4D:
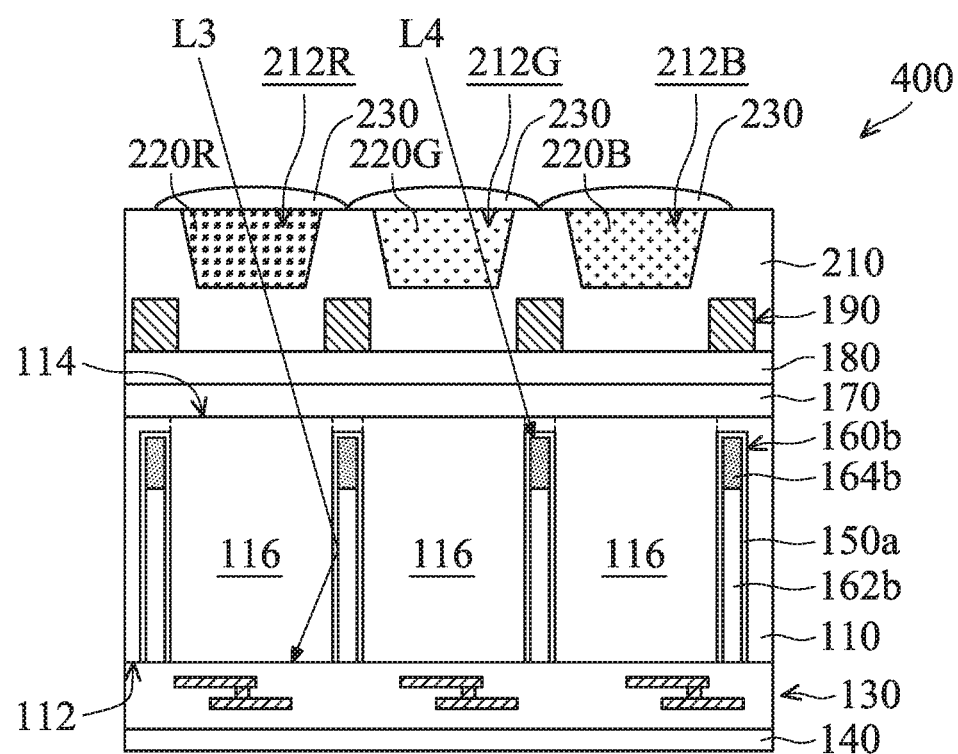

Thereafter, as shown in FIGS. 4C and 4D, a thinning process is performed to thin the semiconductor substrate 110 from the back surface 114. Afterwards, the semiconductor substrate 110 is flipped over.

As shown in FIG. 4D, an anti-reflection coating (ARC) layer 170, a buffer layer 180, a reflective grid 190, a dielectric layer 210, visible light filters (such as color filters 220R, 220G, and 220B), and lenses 230 are sequentially formed over the back surface 114 of the semiconductor substrate 110, in accordance with some embodiments. In this step, an image sensor device 400 is substantially formed, in accordance with some embodiments. In some embodiments, the light absorption structures 164b are positioned closer to the back surface 114 than to the front surface 112, and the light reflection structures 162b are positioned closer to the front surface 112 than to the back surface 114.

As shown in FIG. 4D, an incident light L3 passing through the color filters 220R and arriving at the light reflection structure 162b is reflected by the light reflection structures 162b, in accordance with some embodiments. An incident light L4 passing through the color filters 220G and arriving at the light absorption structure 164b may be absorbed by the light absorption structure 164b, which prevents the incident light L4 from being reflected to an adjacent light-sensing region 116. Therefore, the light-blocking structures 160b composed of the light reflection structure 162b and the light absorption structure 164b may reduce optical crosstalk.

In accordance with some embodiments, image sensor devices and methods for forming the same are provided. The methods (for forming the image sensor devices) form light-blocking structures in deep trenches between light-sensing regions in a semiconductor substrate. The light-blocking structures may block incident light arriving at the light-blocking structures to prevent the incident light from traveling between the different light-sensing regions. Therefore, optical crosstalk is reduced. Furthermore, the methods form an insulating layer in the deep trenches to electrically isolate the light-sensing regions from one another, which reduces electrical crosstalk.

In accordance with some embodiments, an image sensor device is provided. The image sensor device includes a semiconductor substrate including a front surface, a back surface opposite to the front surface, and a light-sensing region extending from the front surface into the semiconductor substrate. The image sensor device includes a light-blocking structure in the semiconductor substrate and adjacent to the light-sensing region. The light-blocking structure includes a conductive light reflection structure and a light absorption structure, and the light absorption structure is between the conductive light reflection structure and the back surface. The image sensor device includes an insulating layer between the light-blocking structure and the semiconductor substrate.

In accordance with some embodiments, an image sensor device is provided. The image sensor device includes a semiconductor substrate including a front surface, a back surface opposite to the front surface, and a light-sensing region extending from the front surface into the semiconductor substrate. The image sensor device includes a conductive light reflection structure penetrating into the semiconductor substrate from the front surface and adjacent to the light-sensing region. The conductive light reflection structure has an end surface facing the back surface. The image sensor device includes a light absorption structure in the semiconductor substrate and between the end surface of the conductive light reflection structure and the back surface. The image sensor device includes an insulating layer in the semiconductor substrate and adjacent to the conductive light reflection structure and the light absorption structure to separate the conductive light reflection structure and the light absorption structure from the semiconductor substrate.

In accordance with some embodiments, an image sensor device is provided. The image sensor device includes a semiconductor substrate including a front surface, a back surface opposite to the front surface, and a light-sensing region extending from the front surface into the semiconductor substrate. The image sensor device includes a conductive light reflection structure penetrating into the semiconductor substrate from the front surface. The conductive light reflection structure is adjacent to the light-sensing region. The image sensor device includes a light absorption structure in the semiconductor substrate and between the conductive light reflection structure and the back surface, wherein a first sidewall of the conductive light reflection structure and a second sidewall of the light absorption structure are substantially coplanar. The image sensor device includes an insulating layer in the semiconductor substrate and adjacent to the conductive light reflection structure and the light absorption structure to separate the conductive light reflection structure and the light absorption structure from the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
a semiconductor substrate comprising a front surface, a back surface opposite to the front surface, and a light-sensing region extending from the front surface into the semiconductor substrate;
a light-blocking structure in the semiconductor substrate and adjacent to the light-sensing region, wherein the light-blocking structure comprises a conductive light reflection structure and a light absorption structure, the light absorption structure is between the conductive light reflection structure and the back surface, the conductive light reflection structure has a light reflectivity ranging from 60% to 100%, the light absorption structure has a light absorptivity ranging from 60% to 100%, the light absorption structure is in direct contact with the conductive light reflection structure, and a boundary is between the light absorption structure and the conductive light reflection structure and extends toward the light-sensing region;
an insulating layer between the light-blocking structure and the semiconductor substrate, wherein the insulating layer conformally covers a first sidewall of the light absorption structure and a second sidewall of the conductive light reflection structure, and the boundary extends to the insulating layer; and
a lens over the back surface and covering the light-sensing region.

2. The image sensor device as claimed in claim 1, wherein a first top surface of the conductive light reflection structure, a second top surface of the insulating layer, and the front surface are substantially coplanar.

3. The image sensor device as claimed in claim 1, wherein the light absorption structure comprises a black silicon material, and the insulating layer separates the light absorption structure from the semiconductor substrate to electrically isolate the light absorption structure from the semiconductor substrate.

4. The image sensor device as claimed in claim 1, wherein the conductive light reflection structure comprises a metal material or an alloy material.

5. The image sensor device as claimed in claim 1, wherein the semiconductor substrate is partially between the light absorption structure and the back surface.

6. The image sensor device as claimed in claim 1, further comprising:
an anti-reflection coating layer over the back surface of the semiconductor substrate;
a buffer layer over the anti-reflection coating layer and covering the light-sensing region; and
a reflective grid over the buffer layer, wherein the reflective grid comprises at least one reflective element, and the light absorption structure is between the at least one reflective element and the conductive light reflection structure.

7. The image sensor device as claimed in claim 6, wherein a first width of the at least one reflective element is greater than both of a second width of the conductive light reflection structure and a third width of the light absorption structure.

8. An image sensor device, comprising:
a semiconductor substrate comprising a front surface, a back surface opposite to the front surface, and a light-sensing region extending from the front surface into the semiconductor substrate;
a conductive light reflection structure penetrating into the semiconductor substrate from the front surface and adjacent to the light-sensing region, wherein the conductive light reflection structure has an end surface facing the back surface;
a light absorption structure in the semiconductor substrate and between the end surface of the conductive light reflection structure and the back surface, wherein the light absorption structure is thinner than the conductive light reflection structure in a direction perpendicular to the back surface, the light absorption structure has a higher light absorptivity than the conductive light reflection structure, the conductive light reflection structure has a higher light reflectivity than the light absorption structure, and the conductive light reflection structure is in direct contact with the light absorption structure; and
an insulating layer in the semiconductor substrate and conformally covering the conductive light reflection structure and the light absorption structure to separate the conductive light reflection structure and the light absorption structure from the semiconductor substrate, wherein a boundary between the conductive light reflection structure and the light absorption structure straightly extends toward the light-sensing region and ends at the insulating layer.

9. The image sensor device as claimed in claim 8, wherein the conductive light reflection structure is in direct contact with the light absorption structure.

10. The image sensor device as claimed in claim 8, further comprising:
a reflective grid over the back surface, wherein the reflective grid comprises at least one reflective element, and the at least one reflective element, the light absorption structure, and the conductive light reflection structure are arranged along a straight line.

11. The image sensor device as claimed in claim 8, further comprising:
a color filter over the back surface, wherein the color filter is over the light-sensing region; and
a lens over the color filter.

12. An image sensor device, comprising:
a semiconductor substrate comprising a front surface, a back surface opposite to the front surface, and a light-sensing region extending from the front surface into the semiconductor substrate;
a conductive light reflection structure penetrating into the semiconductor substrate from the front surface, wherein the conductive light reflection structure is adjacent to the light-sensing region;
a light absorption structure in the semiconductor substrate and between the conductive light reflection structure and the back surface, wherein a first sidewall of the conductive light reflection structure and a second sidewall of the light absorption structure are substantially coplanar and connected to each other, and a boundary is between the conductive light reflection structure and the light absorption structure and extends toward the light-sensing region from a cross-sectional view of the conductive light reflection structure, the light absorption structure, and the semiconductor substrate; and
an insulating layer in the semiconductor substrate and in direct contact with the first sidewall of the conductive light reflection structure and the second sidewall of the light absorption structure to separate the conductive light reflection structure and the light absorption structure from the semiconductor substrate.

13. The image sensor device as claimed in claim 12, wherein a first top surface of the conductive light reflection structure, a second top surface of the insulating layer, and the front surface are substantially coplanar.

14. The image sensor device as claimed in claim 13, further comprising:
   a dielectric layer over the front surface, wherein the dielectric layer is in direct contact with the conductive light reflection structure, the insulating layer, and the semiconductor substrate.

15. The image sensor device as claimed in claim 12, wherein the insulating layer is spaced apart from the back surface.

16. The image sensor device as claimed in claim 12, further comprising:
   a reflective grid over the back surface, wherein the reflective grid comprises at least one reflective element, and the at least one reflective element, the light absorption structure, and the conductive light reflection structure are aligned with each other.

17. The image sensor device as claimed in claim 12, wherein the back surface is more close to the boundary than the front surface.

18. The image sensor device as claimed in claim 12, wherein the conductive light reflection structure has a light reflectivity ranging from 60% to 100%, and the light absorption structure has a light absorptivity ranging from 60% to 100%.

19. The image sensor device as claimed in claim 8, wherein the light absorption structure is made of a polymer material.

20. The image sensor device as claimed in claim 6, wherein the conductive light reflection structure and the light absorption structure are made of different materials.

* * * * *